US006839361B2

(12) United States Patent
Marin et al.

(10) Patent No.: US 6,839,361 B2
(45) Date of Patent: Jan. 4, 2005

(54) LOCAL MULTIPOINT DISTRIBUTION SERVICE BASE STATION APPARATUS

(75) Inventors: James Scott Marin, Murphy, TX (US); William K. Myers, McKinney, TX (US); Donald G. Burt, Richardson, TX (US); Michael L. Brobston, Allen, TX (US); Andrew Cilia, Grand Prairie, TX (US)

(73) Assignee: Cisco Technology, Inc., San Jose, CA (US)

( * ) Notice: Subject to any disclaimer, the term of this patent is extended or adjusted under 35 U.S.C. 154(b) by 30 days.

(21) Appl. No.: 10/188,008

(22) Filed: Jul. 1, 2002

(65) Prior Publication Data

US 2002/0174441 A1 Nov. 21, 2002

(Under 37 CFR 1.47)

Related U.S. Application Data

(63) Continuation of application No. 09/184,498, filed on Nov. 2, 1998, now Pat. No. 6,501,768.

(51) Int. Cl.[7] .......................... H04B 7/212; H04J 1/00; H04Q 7/20
(52) U.S. Cl. ...................... 370/535; 370/347; 370/487; 455/422; 455/453; 725/118
(58) Field of Search ................................ 370/347, 350, 370/465, 432, 443, 487, 535, 536, 328, 329, 330; 455/422, 426, 450, 453; 725/64, 68, 71, 126, 138; 359/109, 123, 113, 115

(56) References Cited

U.S. PATENT DOCUMENTS

| 4,429,417 A | | 1/1984 | Yool |
| 5,234,348 A | | 8/1993 | Konsevich et al. ............ 439/61 |
| 5,625,627 A | | 4/1997 | Ishi ............................ 370/347 |
| 5,754,961 A | | 5/1998 | Serizawa et al. ............ 455/517 |
| D396,897 S | | 8/1998 | Evans et al. .................. 455/6.2 |
| 5,790,959 A | * | 8/1998 | Scherer ........................ 455/561 |
| 5,809,431 A | * | 9/1998 | Bustamante et al. ......... 455/562 |
| 5,818,832 A | | 10/1998 | McCallister ................. 370/350 |
| 5,844,939 A | * | 12/1998 | Scherer et al. ............... 375/219 |
| 5,896,473 A | | 4/1999 | Kaspari ........................ 385/24 |
| 5,924,039 A | | 7/1999 | Hugenberg et al. .......... 455/347 |
| 5,949,766 A | | 9/1999 | Ibanez-Meier et al. |
| 5,949,769 A | * | 9/1999 | Davidson et al. ............ 370/329 |
| 5,980,312 A | | 11/1999 | Chapman et al. ......... 439/540.1 |
| 6,006,069 A | * | 12/1999 | Langston ..................... 455/62 |
| 6,047,177 A | * | 4/2000 | Wickman ..................... 455/422 |
| 6,052,582 A | | 4/2000 | Blasing et al. |
| 6,118,976 A | * | 9/2000 | Arias et al. ................... 455/5.1 |
| 6,226,280 B1 | * | 5/2001 | Roark et al. ................. 370/330 |
| 6,236,678 B1 | * | 5/2001 | Horton, Jr. et al. ......... 375/222 |
| 6,240,556 B1 | * | 5/2001 | Evans et al. ................. 725/114 |
| 6,243,377 B1 | * | 6/2001 | Phillips et al. ............... 370/354 |
| 6,243,427 B1 | * | 6/2001 | Stockton et al. ............. 375/308 |
| 6,349,095 B1 | * | 2/2002 | Hugenberg et al. .......... 370/343 |
| 6,349,123 B1 | * | 2/2002 | Kim ............................ 375/480 |
| 6,456,823 B1 | * | 9/2002 | Black ......................... 455/3.01 |
| 6,580,728 B1 | * | 6/2003 | Cook et al. .................. 370/487 |
| 6,650,628 B1 | * | 11/2003 | Boch .......................... 370/330 |
| 6,665,279 B1 | * | 12/2003 | Kwak et al. ................. 370/328 |

FOREIGN PATENT DOCUMENTS

| WO | WO 96/38786 | 12/1996 | ............. B06F/9/46 |
| WO | WO 97/29608 | 8/1997 | ............. H04Z/7/36 |

* cited by examiner

Primary Examiner—Man Phan
(74) Attorney, Agent, or Firm—Baker Botts L.L.P.

(57) ABSTRACT

A local multipoint distribution service base station apparatus for sending and receiving communication signals to and from subscribers includes a base unit having at least one rack which is adapted to receive at least one subrack. At least one communication signal generating unit is also arranged and configured to be received by the subrack. In addition, a transmitting/receiving unit is operationally connected to the base unit for transmitting and/or receiving the communication signals to and from the subscribers.

20 Claims, 6 Drawing Sheets

LOCAL MULTIPOINT DISTRIBUTION SERVICE BASE STATION APPARATUS

CROSS REFERENCE TO RELATED APPLICATION

This application is a continuation of U.S. patent application Ser. No. 09/184,498 filed Nov. 2, 1998 and entitled "Local Multipoint Distribution Service Base Station Apparatus" now U.S. Pat. No. 6,501,768 issued Dec. 31, 2002.

TECHNICAL FIELD OF THE INVENTION

The present invention generally relates to a local multipoint distribution service (LMDS) system or local multipoint communication system (LMCS), and more particularly to the base station architecture of the LMDS system.

SUMMARY OF THE INVENTION

The LMDS system provides a "wireless local loop" or the "last mile" link to subscribers for fixed communication services such as video and telephony including data information such as facsimile and computer signals. The LMDS system includes a base station or node for sending and receiving selected communication signals to and from a customer premises equipment (CPE) which is remotely located with the subscribers. In addition to the CPE, the base station is also connected to a video serving office or other distribution centers for video content and to a central office switched telephony network for telephony services. A typical LMDS system consists of several base stations per central office and video serving office, and several thousand CPE sites per base station. In this manner, the LMDS system is a "point-to-multipoint" cellular communication system, the base station being the point, and the CPE sites, the multipoint. The connection between the base station and the subscribers is generally through broadband radio frequency (U). The bandwidth depends on the spectrum allocation but is generally about 1 GHz. The subscriber equipment or CPE tunes to one or more RF frequency channels within the 1 GHz band to connect to the base station.

It is cost effective to have the capacity of the base station correspond to the demand of the subscribers linked to the base station at a given time. However, it is difficult to predict the number of subscribers who will be linked to the base station, especially when the LMDS system is initially being implemented. Consequently, if the number of subscribers grows unexpectedly from the initially projected number, a conventional base station would not be capable of servicing all the subscribers without an extensive and time consuming reconfiguration of the base station, which is an expensive operation. On the other hand, if the number of subscribers predicted is too high or if a significant number of the subscriptions is canceled, the base station would operate at undercapacity.

Also, the conventional base stations generally include a base unit and a remote unit which are physically partitioned from each other. The remote unit includes an antenna which is located, for example, on a tower or on top of a building, and is connected to the other parts of the remote unit via a long wave-guide. A disadvantage of using a long waveguide is that it is expensive and prone to excessive loss (approximately 15 dB/100 ft). Routing the wave-guide to the top of a building, for example, is also a difficult task.

Accordingly, it is a primary object of the present invention to provide an improved base station for cost effectively implementing an LMDS system.

Another object is to provide an improved base station having a base unit which has a modular configuration to allow operation of both small and large systems.

Still another object is to provide an improved base station having a modular configuration for grouping similar functions into proximately located shelves to minimize cabling and RF signal impairments.

A further object is to provide an improved base station having a remote unit which minimizes the length of the wave-guide between an antenna and the other remote unit electronics.

Yet another object is to provide an improved base station having a remote unit which integrates an antenna and the associated transmitter and receiver into a single assembly.

BRIEF DESCRIPTION OF THE DRAWINGS

For a more complete understanding of the present invention and the advantages thereof, reference is made to the following description taken in conjunction with the accompanying drawings, wherein like reference numerals represent like parts, in which.

DETAILED DESCRIPTION OF THE INVENTION

The present invention is directed to the architecture of a base station of a local multipoint distribution cellular communication system that can provide telephony/data and video services to residential, business and educational facilities. One of the novel features of the present base station is that the components of the base station are provided in modules according to their functions, so that these modules can be added or removed correspondingly with an increase or a decrease in demand on the base station. Another novel feature of the present invention is that the antenna is integrated into an assembly with the electronics of the transmitting/receiving unit of the base station.

Broadly stated, a local multipoint distribution service base station apparatus for sending and receiving communication signals to and from a plurality of remotely located subscriber equipment includes a base unit having at least one rack, which is configured and adapted to receive at least one subrack. Also at least one communication signal generating unit is arranged and configured to be received in the subrack. A transmitting/receiving unit is operationally connected to the base unit for transmitting and receiving the communication signals to and from the subscriber equipment.

In another embodiment, a local multipoint distribution service base station apparatus for sending and receiving communication signals to and from subscriber equipment includes a communication signal generating unit for generating the communication signals. A transmitting/receiving unit is operationally connected to the communication signal generating unit and is adapted to transmit/receive the communication signals to and from the subscriber equipment. Also, an antenna unit is operatively connected to the transmitting/receiving unit for directing and receiving the communication signals to and from the subscriber equipment. The antenna unit and the transmitting/receiving unit are arranged and configured into an integrated assembly.

Figure 1:
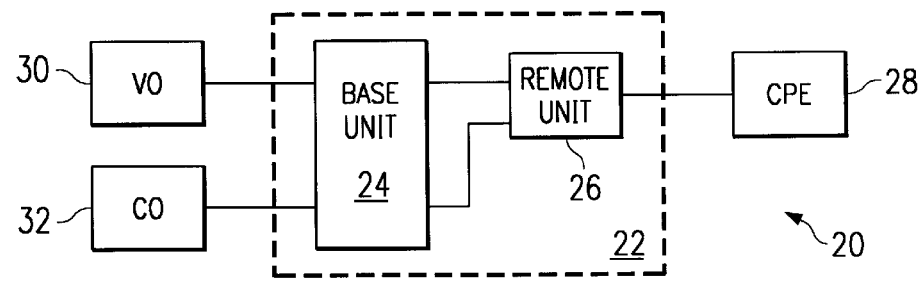
FIG. 1 is a block diagram of a local multipoint distribution service system of this invention.

Turning now to the drawings, and particularly FIG. 1, a block diagram of a local multipoint distribution service (LMDS) system, indicated generally at 20, is shown and generally includes a base station or node 22 having a base unit 24 and a remote unit 26. The remote unit 26 is linked to a customer premises equipment (CPE) 28 which receives video, and/or telephony services from the base station 22. The base unit 24 is connected to a video serving office (VO) 30 or other distribution centers that provide the video content to the base station 22. Also connected to the base unit 24 is a central office (CO) switch 32 which provides the telephony services.

Figure 2:
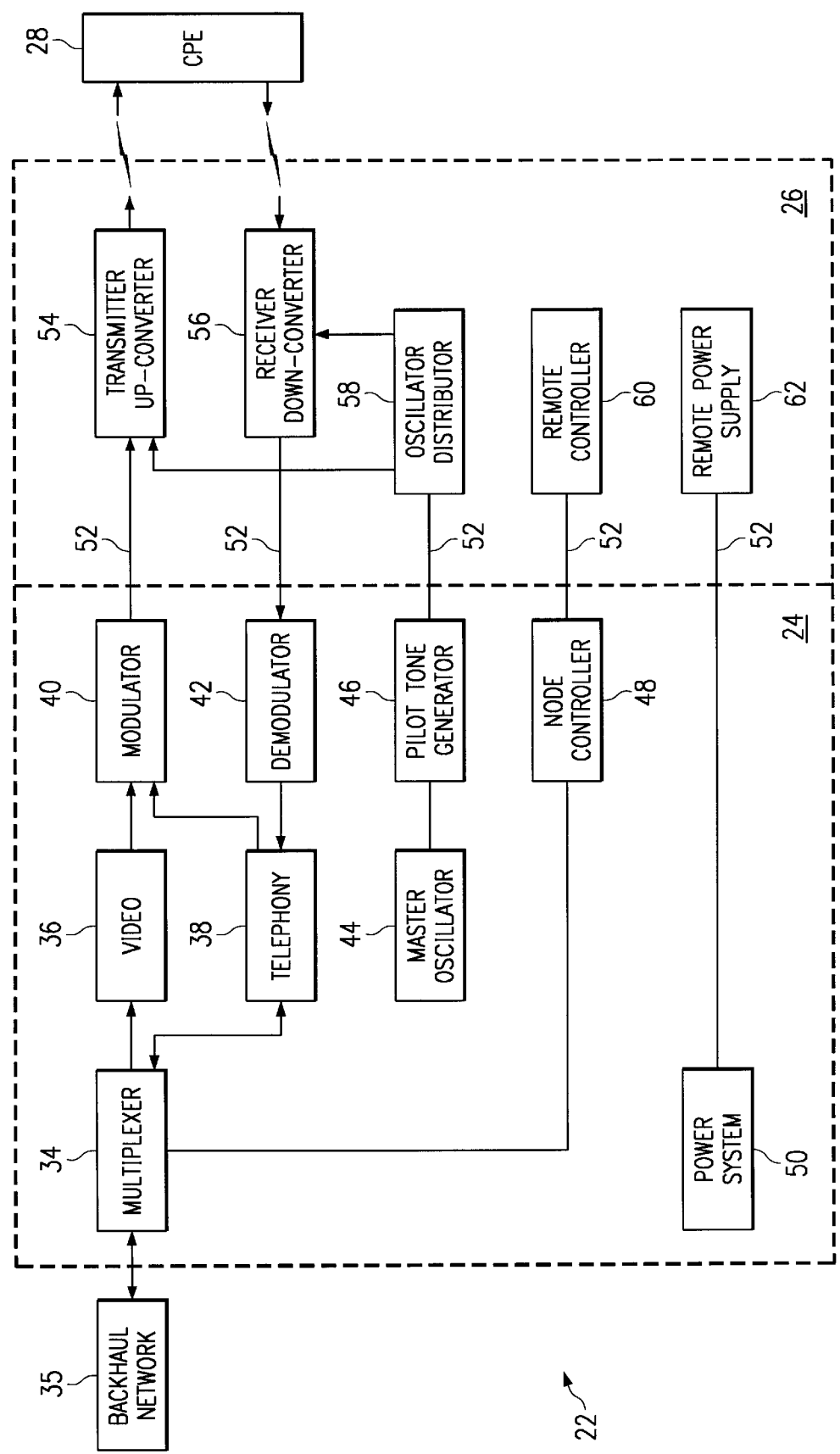
FIG. 2 is a block diagram of a base station embodying the present invention.

Turning now to FIG. 2, the base unit 24 includes a multiplexer 34 which connects the base station 22 to the VO 30 and the CO 32 via a known "backhaul" network 35 such as an OC-x synchronous optical network (SONET) ring or a DS3 network, which are broad bandwidth networks. If the connection is made to a DS3 network the multiplexer 34 provides the multiplexing from DS3 (44 Mbps) rates to DS1 (1.544 Mbps) rates and if connected to a SONET network, the multiplexer 34 translates from OC-48 (2.488 Mbps) rates to OC-3 (155 Mbps) rates.

The video signals from the multiplexer 34 are supplied to the video unit 36, which allows the mapping between RF channels, in which the video signals are sent to the subscribers, and the backhaul channels. The RF carriers containing the video channels can be analog or digitally modulated. The telephony signals from the multiplexer 34 are supplied to a telephony unit 38 which performs multiplexing and demultiplexing functions to convert downstream signals (base station to CPE) and upstream signals (CPE to base station) into asymmetric data streams. For downstream transmission, the telephony unit bundles as much traffic as possible into a downstream RF carrier. For example, the industry standard transmission format such as OC-3, DS 1 or E1 (2.048 Mbps) is bundled into a high-speed time-division-multiplexed signal (e.g., DS3). In the preferred embodiment, the bundled signal contains 28 Tls, (44.7 Mbps) or 16 E1s for international applications. Additional control bytes are added for forward error correction, radio control, and potentially for encryption.

Thus described feature in which data is sent at an asymmetric rate during the upstream and downstream transmissions is an important aspect of the present invention. High-speed telephony downstream transmission is ideally suited for a point-to-multipoint communication in that the signals are broadcast to all receivers. Each receiver tunes to a designated frequency and time slot; however, each receiver has access to any downstream signals. The receiver demultiplexes the downstream signals to recover only the bit stream of interest. By increasing the downstream data rate, the number of downstream transmitters (or number of RF carriers per transmitter) can be reduced. In addition, every RF channel requires some amount of guard-band to prevent adjacent channel interference. Fewer channels take fewer guard-bands and therefore, more payload can be sent per a given band. As a result, the spectral efficiency is increased.

Upstream transmission is performed at a lower rate of about 3.3 Mbps, which accommodates both DS 1 and E1 payloads and can be either in continuous format or burst format. The telephony unit 38 is used to reformat the data to a symmetric format for transmission by the multiplexer 34 to the backhaul network 35. Continuous format supports fixed services such as T1 or E1. In burst mode, multiple CPEs 28 can share an RF channel using a time-division multiple access (TDMA) scheme. With the TDMA scheme, the time of transmission of a burst must be timed such that the bursts arrive at the receiving base station 22 at a precise time. Preferably, the burst format consists of a 28 byte pocket in a 2 milli-second frame to support the DS1 telephony frame rate. In this manner, twenty-four subscribers can be accommodated on a single RF channel which provides full rate 64 kbps service to each CPE 28.

Modulators 40 (one shown), which are digital video broadcast (DVB) compliant, for example, connect to the output of the video unit 36 and the telephony unit 38, and modulate the received signals onto a L-band, intermediate frequency signals (950 to 1950 MHZ), and send the modulated signals to the remote unit 26. The digital video and the telephony signals are preferably quadrature phase shift key (QPSK) modulated, which requires less signal-to-noise ratio than most other modulation formats, and therefore provides the longest range. For analog video signals, the invention can be implemented such that the modulators 40 perform frequency modulation (FM). Upstream signals received from the CPE 28 via the remote unit 26 are supplied to demodulators 42 (one shown) which perform a QPSK demodulation and send the signals onto the telephony unit 38.

Another important aspect of the present invention is that a master oscillator 44 provides a single frequency reference which is tracked by all the frequency setting components in the LMDS system 20. Throughout the base unit 24, oscillator signals are frequency division multiplexed onto combiner and distributed networks (not shown) along with payload signals to minimize the need for a separate network to distribute the oscillator signals. In the preferred embodiment an optional pilot tone generator 46, which is a special oscillator that is frequency locked to the master oscillator 44, is used to lock the oscillators on the remote unit 26 and the CPE 28. It can be located either in the base unit 24, as in the preferred embodiment, or in the remote unit 26 and operates at about 96-0 MHZ, for example. Alternatively, two optional pilot tone generators 46 and two master oscillators 44 can be employed in the base station 22 for redundant implementation.

A node controller 48 contains a database of all the provisional items (objects) at the base station 22 and the CPE 28, and provides overall control, provisioning and alarm processing functions. A power system 50 is also provided for converting in-country prime power to −48 VDC which is distributed through the base and the remote units 24, 26.

The base unit 24 is connected to the remote unit 26 via a fiber optic link 52 which carries the signals transmitted between the two units 24, 26. The fiber optic link 52 is preferable because it provides better immunity to lighting than copper wires, and allows the remote unit 26 to be located from the base unit 24 by as long as several miles. For example, the remote unit 26 may be placed on a tower or a tall structure such as a building, and the base unit 24 may be located in an equipment room or remotely from the remote unit 26 in an equipment building such as the central office 32. It should be noted that a coaxial cable(s) may also be employed to connect the base unit 24 and the remote unit 26 instead of the fiber optic link 52.

An intermediate frequency (IF) protocol is used to interface the base unit 24 with the remote unit 26 to allow the base unit to be independent of the operating frequency of the remote unit. In this manner, different tower equipment assemblies can be "plugged" into a common base unit 24 to solve the problem of supporting different RF bands. L-band IF is preferred because it is high enough so that frequency conversion to 28 GHz can be accomplished in one translation stage and is low enough such that RF components are readily available and reasonably inexpensive. It is contemplated that wireless point-to-point radio can also be used as the connection between the base unit 24 and the remote unit 26.

The remote unit 20 includes a transmitter/up-converter 54 which is connected to the modulator 40 via the fiber optic link 52 for converting the IF signals from the modulator to RF carrier signals, and sending the converted RF signals to the CPE 28. A receiver/down-converter 56 receives the RF signals from the CPE 28 and converts the RF signals to the IF signals, which is then sent to the demodulator 42 in the base unit 22 via the fiber optic link 52.

Distributed oscillators 58 are included to act as separate milli-meter local oscillators for providing reference signals to each of the transmitter/up-converter 54 and the receiver/down-converter 56 for up and down frequency conversions. The oscillators 58 are connected via the fiber optic link 52 to the optional pilot tone generator 46 which provides the preferred common reference frequency of 960 MHZ. By having a separate oscillator 58 for each of the transmitter/up-converter 54 and the receiver/down-converter 56, a problem of having to have a milli-meter wave distribution network is avoided. The distribution network reduces flexibility because it requires knowing the number of ports and mechanical arrangement of the transmitter/up-converter and the receiver/down-converter 54, 56.

In the preferred embodiment, a remote unit controller 60 is operatively connected to the node controller 48 of the base unit 24 via the fiber optic link 52 and acts as a central control computer that collects alarm information and provides a collection point of the control and communications away from the remote site. It should be noted that the utilization of the remote unit controller 60 in the present invention is optional, and that the functions of the remote unit controller can be performed by the node controller 48. The remote power supply 62 is connected to the power system 50 of the base unit 24 and provides the preferred −48 VDC power needed for transmitting and receiving signals to and from the CPE 28.

Figure 3:
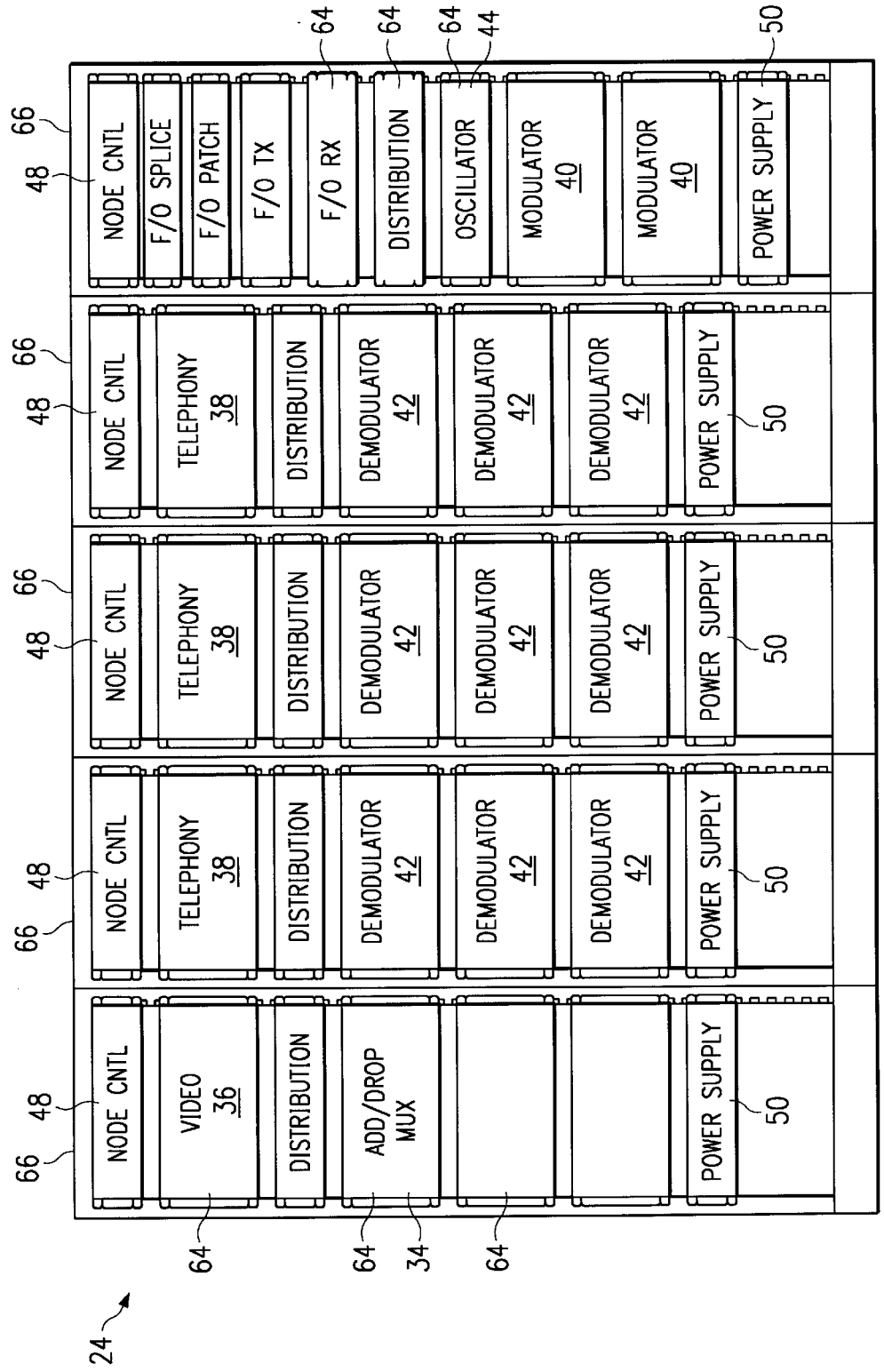
FIG. 3 is a front view of the base unit of FIG. 2.

It is important to note that the base unit 24 may include multiple numbers of each of the components described above depending on the number of subscribers the base unit is designed to service. Thus, one important feature of the present invention is that the components of the base unit 24 performing the same function are physically grouped together into individual modules. Such modular configuration is shown in FIG. 3, in which the base unit 24 is arranged into a number of subracks or shelves 64 within five racks 66. While the base unit 24 shown in FIG. 3 includes one video unit 36 and three telephony units 38, this is only intended to be an example. The actual number of each of the base unit 24 components is dictated by the subscriber capacity, i.e., subracks 64 and racks 66 can be added to increase capacity and removed to decrease capacity. Increasing and decreasing capacity would only require connecting or disconnecting one or more racks 66 to and from the base station 22. In this manner, the modular configuration of the present invention allows the LMDS system 20 to easily adapt to the needs of the subscribers.

In the preferred embodiment, each of the racks 66 includes one subrack 64 for housing the node controller 48. The network of these node controllers 48 in the base unit 24 provides control of equipment settings such as transmission levels, power up sequencing, fault detection and switching, performing monitoring and remote control from a central network management facility. Communication between the racks 66 is preferably through ethernet, and communication between subracks 64 is preferably through an RS-485 bus for low data rate subracks and a VME bus for high data rate subracks. It is important to note that in the preferred embodiment, the subracks 64 having similar functions are arranged so that they are in close proximity to each other. For example, the node controllers 48 are adjacent each other, the telephony units 38 are also adjacent each other and so are the demodulators 42. This is to minimize cabling and RF signal impairments.

Figure 4:
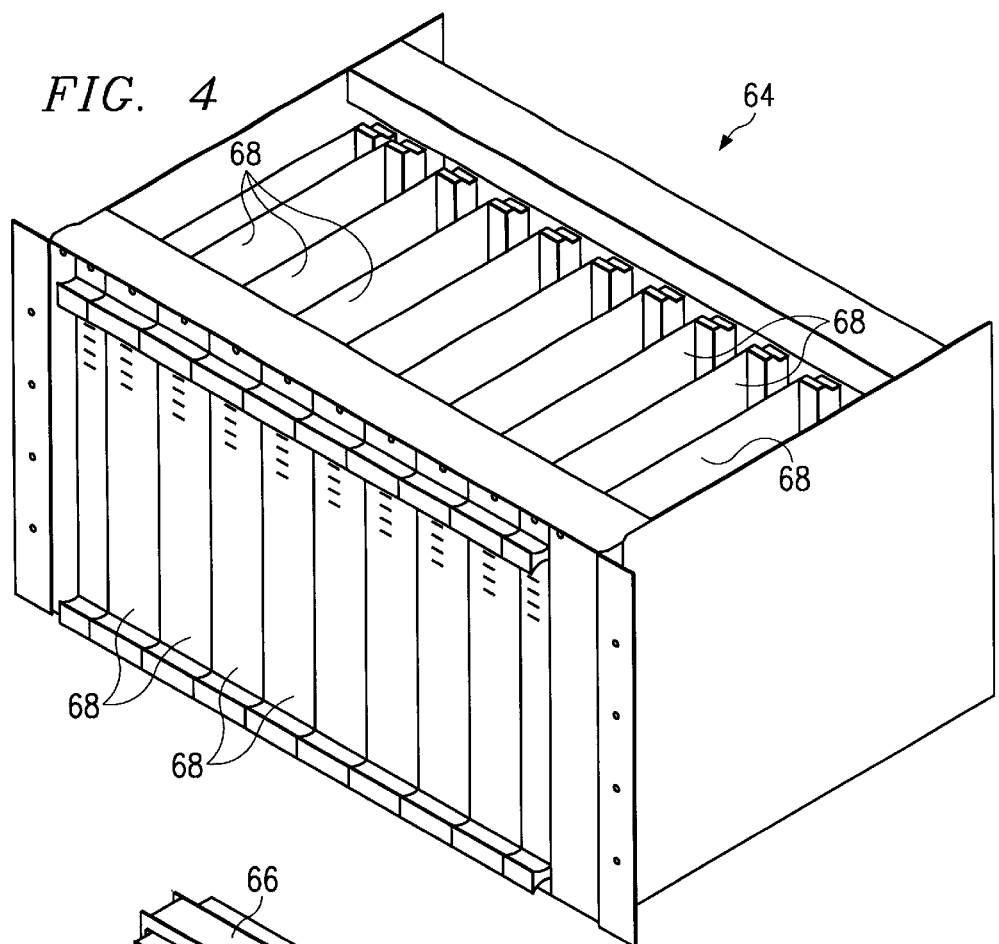
FIG. 4 is a front view one of the racks of FIG. 3.
Figure 5:
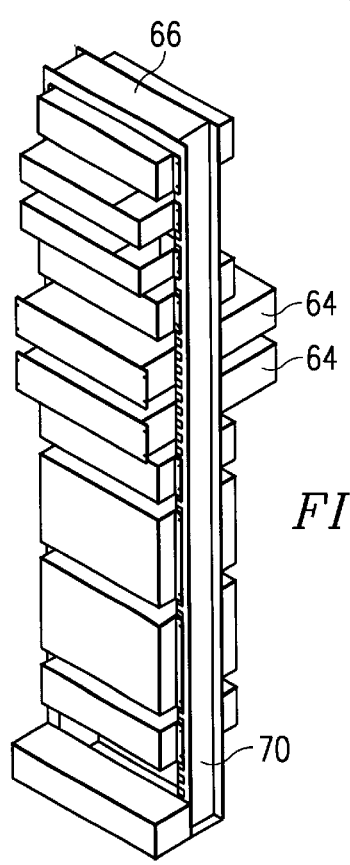
FIG. 5 is a perspective view of one of the racks of FIG. 3.

Turning now to FIG. 4, each of the components in the base unit 24 are integrated onto at least one circuit card assembly (CCA) 68, which are adapted to be received by the subracks 64. The CCAs 68 plug into the subracks 64 and are designated as "line replaceable items." which allow for "live insertion" or "hot swap." Preferably, the connection or "make" of the CCA 68 to the subrack 64 at a connector terminal (not shown) is made in the order of ground power and signal and the disconnection or "break" is made in the order of signal, power and ground. The dimensions of the subracks 64, specifically, the height and the depth, vary accordingly to accommodate the size of the CCAs 68. However, the width should be such that the CCAs 68 is able to fit horizontally between a pair vertical sections 70 (best seen in FIG. 5) of the racks 66. The modularity of the CCA 68 allows components of the base unit 24 to be added or removed with capacity, and repairs to be made by merely replacing the faulty CCA.

Figure 6:
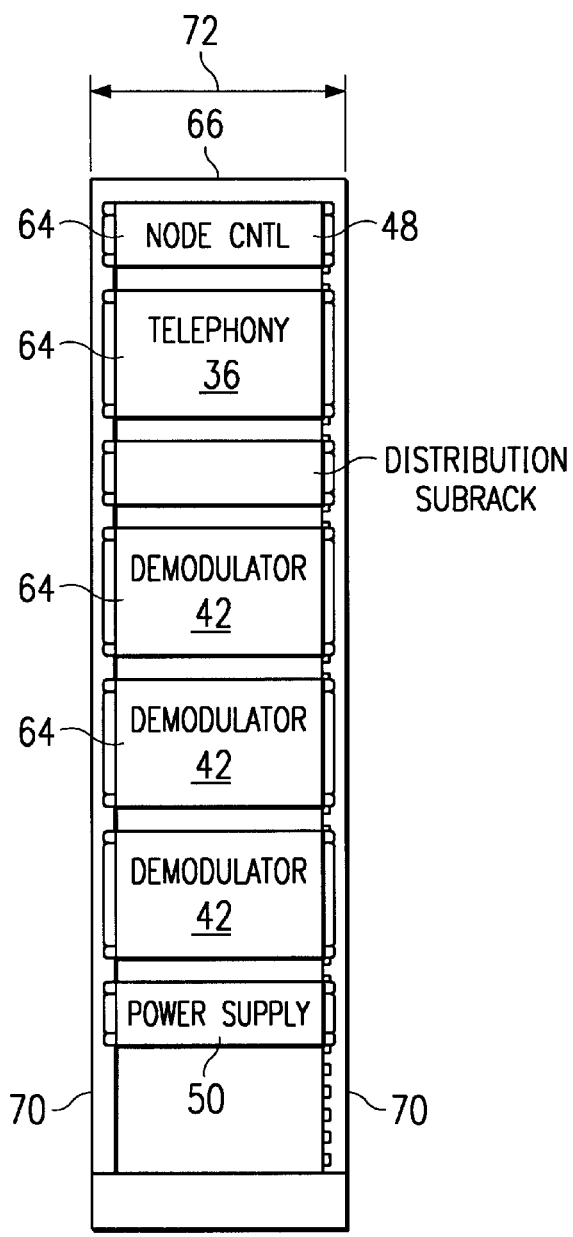
FIG. 6 is a front view of one of the racks of FIG. 3.
Figure 7:
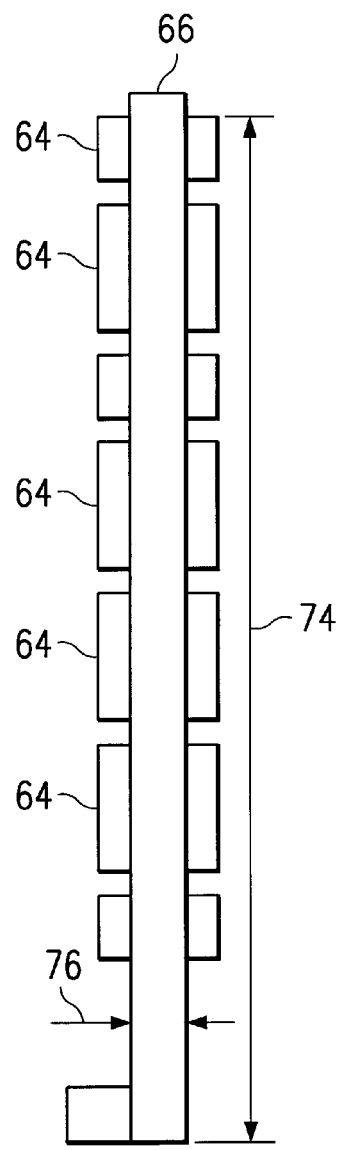
FIG. 7 is a side view of the rack of FIG. 6.

Turning now to FIGS. 6 and 7, one of the racks 66 in FIG. 3 is shown independently, and preferably has a width, as indicated by an arrow 72, of approximately 20 inches, a height, as indicated by an arrow 74, of approximately 84 inches and a depth, as indicated by an arrow 76, of approximately 6 inches. It should be noted that the size of the racks 66 may be varied as necessary to desired dimensions.

Figure 8:
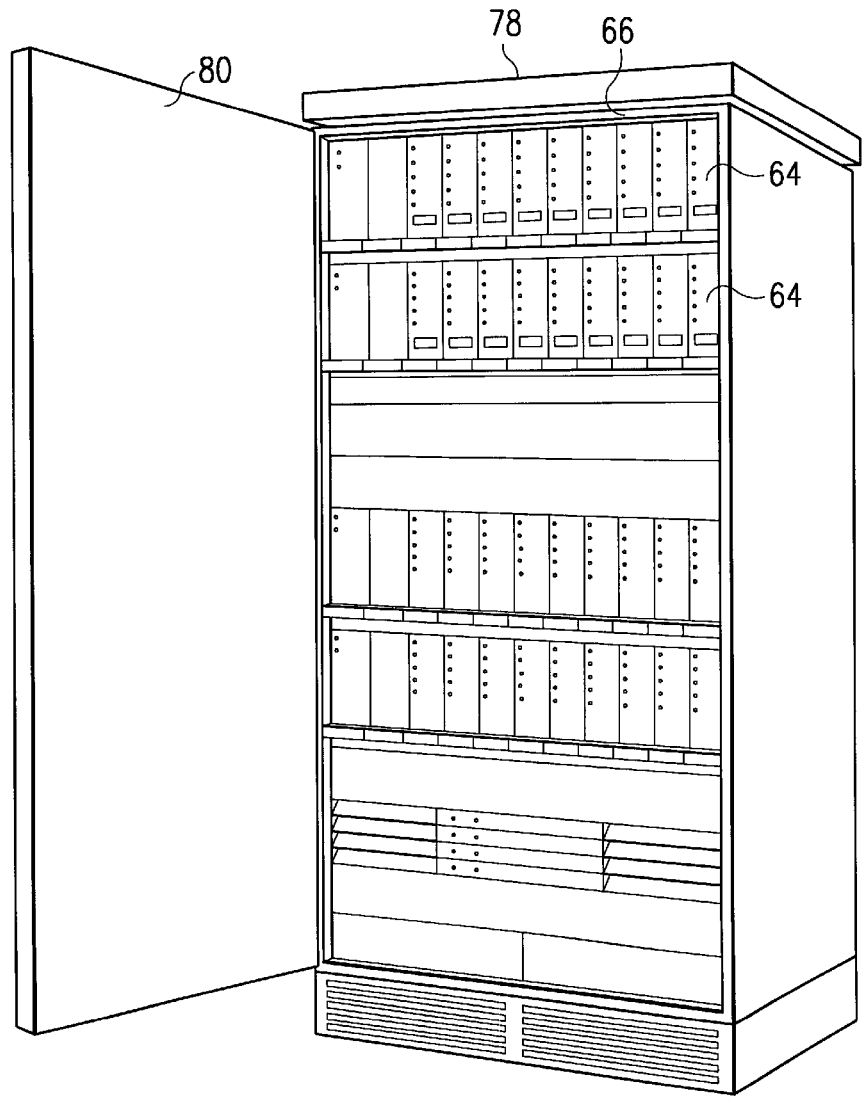
FIG. 8 is a perspective view of a rack enclosed in a housing.

Turning to FIG. 8, the racks 66 and their subracks 64 are preferably fully encased in a housing 78 having an access door 80 in order to meet the conducted and radiated emissions requirement. An open frame racks 66 may also be utilized, provided that the individual CCAs 68 within the subracks 64 are adequately shielded.

Figure 10:
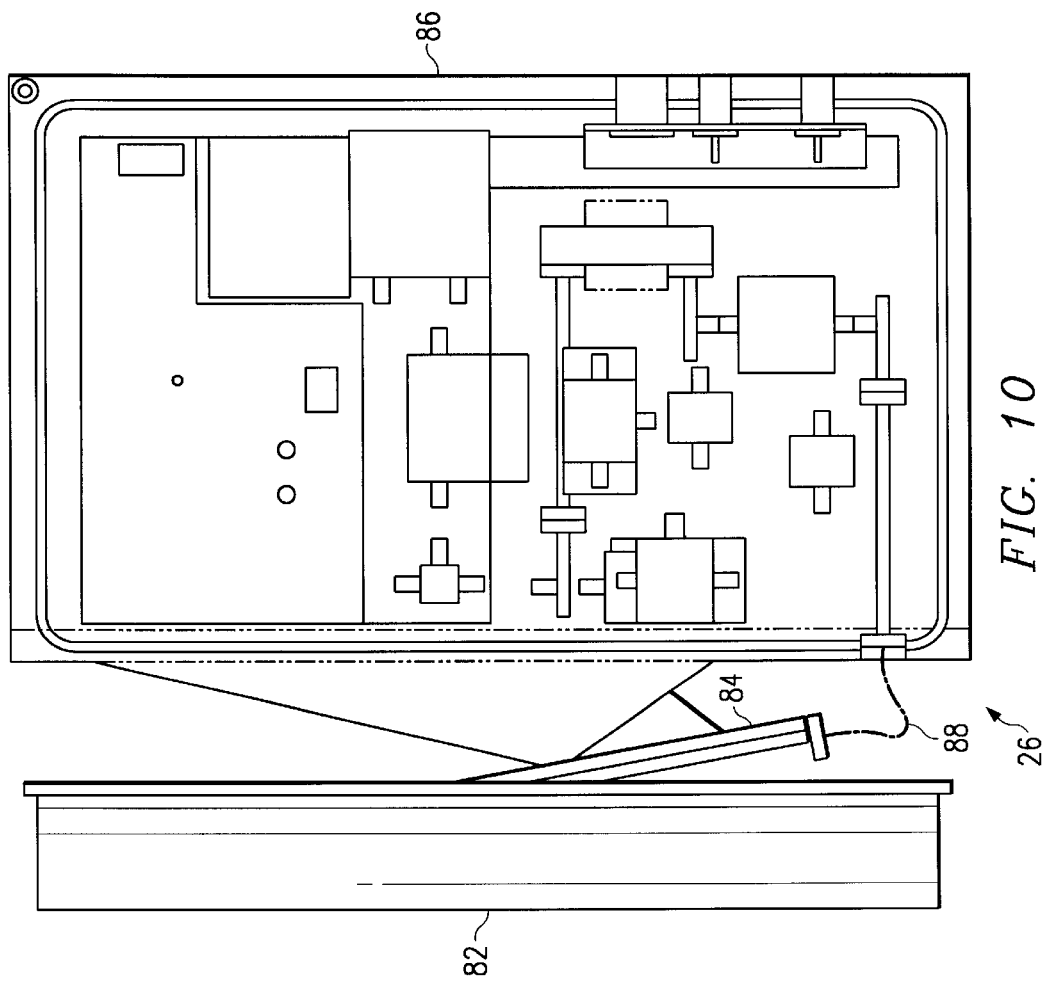
FIG. 10 is a side view of the remote unit of FIG. 9, with the cover removed.
Figure 9:
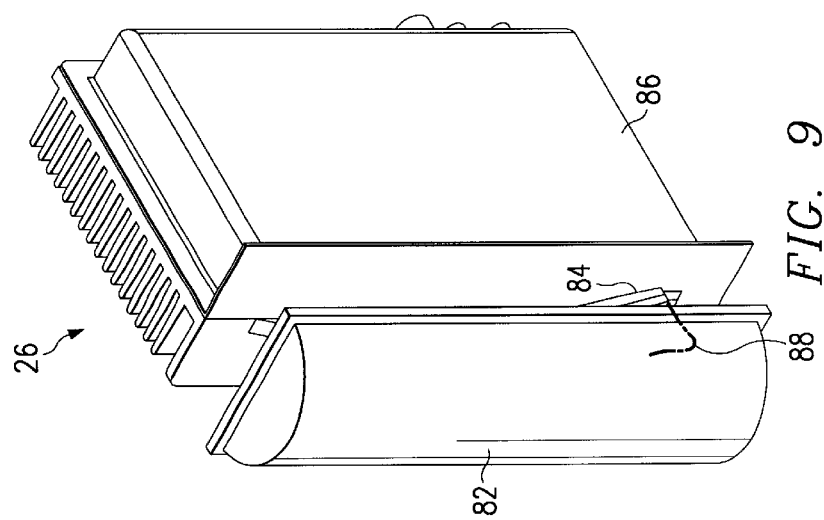
FIG. 9 is a perspective view of a remote unit embodying the present invention.

Turning now to FIGS. 9 and 10, the remote unit 26 is shown to include a radome/polarizer 82, an antenna 84 and an electronic housing 86. An important feature of the present invention is that these components are integrated into a single assembly, with a wave-guide 88 (best shown in FIG. 10, which is a side view the remote unit with cover of the housing 86 removed) connecting the antenna 84 with the components within the electronic housing 86. This arrangement significantly reduces the length of the wave-guide 88, so that the signal loss inherently associated with the wave-guide is minimized.

From the foregoing detailed description, it should be understood that a LMDS base station apparatus for sending and receiving telephony and video signals to and from multitude of subscribers has been shown which has many advantages and desirable attributes. Of particular advantage is the ability to add capacity in a modular fashion by organizing the various functions of the base station into subracks or shelves. Another advantage is that the antenna and the associated electronics are integrated into a single housing, thereby reducing the length of the connection between the antenna and the other components.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A method for sending communication signals to remotely located subscriber equipment, comprising:
    receiving video signals from a video source and telephony signals from a telephony source multiplexed onto a single transmission stream, the telephony signals including voice signals;
    extracting the video signals from the transmission stream;
    placing the video signals into an asymmetric data stream;
    extracting the telephony signals from the transmission stream;
    placing the telephony signals into an asymmetric data stream;
    modulating the telephony and video signals onto an intermediate transmission frequency;
    converting the intermediate transmission frequency to a radio transmission frequency in order to transmit the telephony and video signals.

2. The method of claim 1, wherein the intermediate transmission frequency provides isolation between telephony and video signal processing and transmission.

3. The method of claim 1, further comprising:
    providing a single frequency reference to process the telephony and video signals.

4. The method of claim 1, wherein the telephony and video signals are modulated using quadrature phase shift key modulation.

5. The method of claim 1, further comprising:
    implementing each telephony and video signal processing functionality as a separate replaceable module with different physical structures;
    grouping the replaceable modules together according to their respective functionalities.

6. A method for receiving communication signals from remotely located subscriber equipment, comprising:
    receiving telephony signals in an asymmetric data stream on an intermediate transmission frequency;
    demodulating the telephony signals from the intermediate transmission frequency;
    reformatting the telephony signals into a symmetric format;
    multiplexing the telephony signals;
    transmitting the telephony signals to a central office;
    receiving the telephony signals on a radio transmission frequency;
    converting the radio transmission frequency to an intermediate transmission frequency.

7. The method of claim 6, wherein the telephony signals in the asymmetric data stream are received in either a continuous or burst format.

8. The method of claim 6, further comprising:
    providing a single frequency reference to process the telephony signals.

9. The method of claim 6, wherein the intermediate transmission frequency isolates telephony signal processing from telephony signal reception.

10. The method of claim 6, further comprising:
    implementing each telephony signal processing functionality as a separate replaceable module with different physical structures;
    grouping the replaceable modules together according to their respective functionalities.

11. A system for sending communication signals to remotely located subscriber equipment, comprising:
    means for receiving video signals from a video source and telephony signals from a telephony source multiplexed onto a single transmission stream, the telephony signals including voice signals;
    means for extracting the video signals from the transmission stream;
    means for placing the video signals into an asymmetric data stream;
    means for extracting the telephony signals from the transmission stream;
    means for placing the telephony signals into an asymmetric data stream;
    means for modulating the telephony and video signals onto an intermediate transmission frequency;
    means for converting the intermediate transmission frequency to a radio transmission frequency in order to transmit the telephony and video signals.

12. The system of claim 13, wherein the intermediate transmission frequency provides isolation between telephony and video signal processing and transmission.

13. The system of claim 11, further comprising:
    means for providing a single frequency reference to process the telephony and video signals.

14. The system of claim 11, wherein the telephony and video signals are modulated using quadrature phase shift key modulation.

15. The system of claim 11, further comprising:
    means for implementing each telephony and video signal processing functionality as a separate replaceable module with different physical structures;
    means for grouping the replaceable modules together according to their respective functionalities.

16. A system for receiving communication signals from remotely located subscriber equipment, comprising:
    means for receiving telephony signals in an asymmetric data stream on an intermediate transmission frequency, the telephony signals including voice signals;
    means for demodulating the telephony signals from the intermediate transmission frequency;
    means for reformatting the telephony signals into a symmetric format;
    means for multiplexing the telephony signals;
    means for transmitting the telephony signals to a central office;
    means for receiving the telephony signals on a radio transmission frequency;
    means for converting the radio transmission frequency to an intermediate transmission frequency.

17. The system of claim 16, wherein the telephony signals in the asymmetric data stream are received in either a continuous or burst format.

18. The system of claim 16, further comprising:
means for providing a single frequency reference to process the telephony signals.

19. The system of claim 16, wherein the intermediate transmission frequency isolates telephony signal processing from telephony signal reception.

20. The system of claim 16, further comprising:
means for implementing each telephony signal processing functionality as a separate replaceable module with different physical structures;
means for grouping the replaceable modules together according to their respective functionalities.

* * * * *

UNITED STATES PATENT AND TRADEMARK OFFICE
CERTIFICATE OF CORRECTION

PATENT NO. : 6,839,361 B2  Page 1 of 1
DATED : January 4, 2005
INVENTOR(S) : Marin et al.

It is certified that error appears in the above-identified patent and that said Letters Patent is hereby corrected as shown below:

<u>Title page,</u>
Item [56], References Cited, U.S PATENT DOCUMENTS, delete "D396,897S" and insert -- 5,784,119 --.

<u>Column 8,</u>
Line 36, after "Claim" delete "13" and insert -- 11 --.

Signed and Sealed this

Twenty-eighth Day of March, 2006

JON W. DUDAS
*Director of the United States Patent and Trademark Office*